United States Patent
Nishimuro et al.

(10) Patent No.: US 6,505,839 B1
(45) Date of Patent: Jan. 14, 2003

(54) GASKETED COVER, COVER FOR ELECTRONIC EQUIPMENT AND PROCESS FOR PRODUCING THE COVERS

(75) Inventors: Youichi Nishimuro, Tokyo (JP); Shinichi Toyosawa, Saitama-ken (JP); Kunio Machida, Tokyo (JP)

(73) Assignee: Bridgestone Corporation, Tokyo (JP)

( * ) Notice: Subject to any disclaimer, the term of this patent is extended or adjusted under 35 U.S.C. 154(b) by 0 days.

(21) Appl. No.: 09/427,984

(22) Filed: Oct. 27, 1999

(30) Foreign Application Priority Data

Oct. 30, 1998 (JP) .......... 10-309945
Feb. 19, 1999 (JP) .......... 11-040989
Feb. 19, 1999 (JP) .......... 11-040990

(51) Int. Cl.⁷ .............................. F16J 15/02
(52) U.S. Cl. ............ 277/628; 277/641; 277/642; 220/378; 220/241; 220/944
(58) Field of Search ............ 277/592, 650, 277/944, 6, 628, 641, 642; 220/241, 378, 806

(56) References Cited

U.S. PATENT DOCUMENTS

| | | | |
|---|---|---|---|
| 4,575,578 A | * | 3/1986 | Bogan et al. |
| 4,819,953 A | * | 4/1989 | Joh |
| 5,214,091 A | * | 5/1993 | Tanaka et al. |
| 5,334,636 A | * | 8/1994 | Fujii et al. |
| 5,750,249 A | | 5/1998 | Walther et al. |
| 5,845,803 A | * | 12/1998 | Saito et al. |
| 6,011,090 A | * | 1/2000 | Sakogawa et al. |
| 6,121,545 A | * | 9/2000 | Peng et al. |

FOREIGN PATENT DOCUMENTS

| | | |
|---|---|---|
| EP | 0 496 941 | 8/1992 |
| EP | 0 724 380 | 7/1996 |
| EP | 0 961 534 | 12/1999 |
| JP | 58-69991 | 5/1983 |
| WO | WO 99/30544 | 6/1999 |

OTHER PUBLICATIONS

Patent Abstracts of Japan, vol. 018, No. 264 (P–1740), May 19, 1994, JP 06–036548, Feb. 10, 1994.
Patent Abstracts of Japan, vol. 1998, No. 03, Feb. 27, 1998, JP 09–297987, Nov. 18, 1997.
U.S. patent application Ser. No. 09/181,924, filed Oct. 29, 1999, pending.
U.S. patent application Ser. No. 09/330,064, filed Jun. 11, 1999, pending.

(List continued on next page.)

*Primary Examiner*—Anthony Knight
*Assistant Examiner*—E Peavey
(74) *Attorney, Agent, or Firm*—Oblon, Spivak, McClelland, Maier & Neustadt, P.C.

(57) ABSTRACT

There are disclosed a first gasketed cover which has excellent sealing properties and comprises a cover body composed of a thermoplastic resin and a gasket composed of a thermoplastic elastomer and integrated with the cover body; a second gasketed cover which has excellent sealing properties and is capable of preventing the generation of noises due the vibration of the cover and which comprises a cover body, a gasket composed of an elastic body and integratedly attached to the cover body, and a member composed of the elastic body of a type same as or different from that in the gasket and integratedly installed on at least part of the cover body plane portion excluding the gasket portion; an electronic equipment cover which is capable of preventing pressure difference between the inside and the outside thereof and which comprises a cover body and a membrane composed of an elastic body and installed on a hole placed on the plane portion of the cover body, in which the cover body is integrated with the membrane; and processes for producing the first and second gasketed covers and the electronic equipment cover each by any of two-color molding method and inserting molding method.

13 Claims, 4 Drawing Sheets

OTHER PUBLICATIONS

U.S. patent application Ser. No. 09/501,239, filed Feb. 10, 2000, pending.
U.S. patent application Ser. No. 09/503,473, filed Feb. 14, 2000, pending.
U.S. patent application Ser. No. 09/505,683, filed Feb. 17, 2000, pending.
U.S. patent application Ser. No. 09/543,353, filed Apr. 5, 2000, pending.

* cited by examiner

GASKETED COVER, COVER FOR ELECTRONIC EQUIPMENT AND PROCESS FOR PRODUCING THE COVERS

BACKGROUND OF THE INVENTION

1. Field of the Invention

The present invention relates to a gasketed cover which hermetically seals the joint surface between a cover body and a main body in lightweight equipment, for instance, hard disc equipment of a computer; an electronic equipment cover; and processes for the production of said covers. The gasketed cover and an electronic equipment cover according to the present invention are applied to techniques for hermetically sealing the hard disc equipment of a computer installed inside a robot in an automatic manufacturing line or the like so as to completely keep water and air away therefrom.

The gasketed cover according to the present invention can prevent a noise from being generated by the vibration of the cover body at the time of using the gasketed cover. Moreover, the electronic equipment cover according to the present invention can prevent the difference in pressure from occurring between the inside and the outside of the box type main body at the time of using the aforesaid cover.

2. Description of the Related Arts

The development of electronic equipment in recent years really amazes the persons concerned. The above-mentioned equipment, especially integrated circuits which utilizes semiconductors, such as compactified lightweight hard disc equipment are prone to be readily damaged by moisture or dampness in particular.

Accordingly, the hermetically sealing performance of a gasket is a factor of importance for the performance and durability of the electronic equipment, which gasket is used for hermetically sealing the joint surface between a cover body and a box type main body having built-in integrated circuits mentioned above.

It is customary for the purpose of hermetical sealing to integrate a cover body and a box type main body having built-in integrated circuits into equipment by interposing a gasket which hermetically seals the joint surface between said both the bodies and tightening them with fixing bolts. In general, the gasket is adhesively attached to said cover body by means of a double coated tape or the like, which gasket is placed on the joint surface between said cover body and the main body, and interposed therebetween.

The foregoing constitution, however, has often brought about such troubles that long-term usage of the gasket in question lowers the adhesive force of an adhesive coated onto the double coated tape through degeneration, impairs the hermetically sealing function thereof and at the same time, allows dust or moisture to penetrate into the main body, thus unfavorably causing failure of the electronic equipment.

The cover body is usually formed of a metal such as iron, stainless steel and aluminum. The cover body made of a metal is formed by a method in which any of a variety of metallic plates is subjected to punching work or drawing work by the use of a prescribed pressing mold to put the shape thereof in order, and thereafter the worked metal is subjected to an anti-corrosion treatment by non-electrolytic nickel plating, chromium plating, zinc plating or the like.

In the case, however, where the cover body is formed of any of the metals, various molds to be used for punching work or drawing work are needed, and the method of working a metallic plate for the cover body is limited to the above-mentioned working method, whereby the shape of the cover body is restricted to workable shapes. Hence, it is impossible to design the cover body with intricate configuration such as installing a reinforcing rib to enhance the rigidity of the cover body, reinforce only the flange portion thereof and the like. In addition, the problem still remains unsolved in that the heavy metals such as chromium and nickel, which are used for anti-corrosion treatment indispensable for a metal, involve a strong fear of causing environmental destruction.

On the one hand, the gasket has heretofore been produced by punching sheet-like high density polyurethane foam material into a prescribed shape, and the material which is left after the punching is mostly discarded as a waste material. The conventional procedure just mentioned has involved the problems that the yield is worsened thereby, and the gasket formed with said material has a relatively large compression set, thus making it difficult to maintain the hermetically sealing performance for a long period of time and hence deteriorating the durability of the electronic equipment.

The above-mentioned problem relating to the compression set was solved by the adoption of vulcanized rubber such as butyl rubber and EPDM rubber as a material of construction for a gasket, but the problem still remains unsolved in that an unreasonably long time is required by vulcanization.

Accompanying the tendency of compactification and lightweightness of hard disc drives in recent years, the cover body of electronic equipment has been thin-walled. However, the cover body, when formed with a thin-walled metal plate, increases the vibrational frequency of resonance which is generated accompanying the revolution of a spindle motor, thereby bringing about the problem of noisy sound generated at the time of using a hard disc drive. Notwithstanding said problem of noisy sound, no countermeasure thereagainst has been taken in the conventional gasketed cover and cover body.

With regard to the integrated circuits in recent years which make use of semiconductors such as a hard disc apparatus of a compactified lightweight computer, the apparatus is airtightly sealed inside to keep the inside environment constant. For instance, the inside of a hard disc apparatus is airtightly sealed, and thus the environment therein is kept constant by installing a cover body on the main body of the apparatus. However under a complete airtightly sealed condition, a box type main body of the apparatus is often pressurized inside by the rotation of a hard disc driven by a spindle motor, whereby the internal pressure therein is increased. In the case where the apparatus is used under a low temperature environment, the inside thereof is often brought to negative pressure by the shrinkage of the atmosphere therein. In any of the above-mentioned cases, there is caused pressure difference between the inside and outside of the apparatus.

Such being the case, some contrivance has been made so as not to cause the pressure difference therebetween by placing a breathing hole at one portion of the main body of electronic equipment so as to allow outside air to communicate with the space in the main body. Nevertheless, since there is a danger that the breathing hole allows the penetration of a gas and fine foreign matter that are responsible for malfunction of a magnetic disc caused by its accumulation thereon, it is regarded as being necessary to equip the inside of the breathing hole with a dust prevention filter and/or an adsorbent for said gas {refer to Japanese Patent Application Laid-Open No. 36548/1994 (Heisei-6)}. In addition, there is adopted a method in which the breathing hole is slotted so as to prevent sudden change in the pressure inside the main body {refer to Japanese Patent Application Laid-Open No. 297987/1997 (Heisei-9)}. Such breathing mechanism, although effective in preventing the pressure difference from being caused between the inside and outside of the apparatus, complicates the production steps of the apparatus because of the intricate mechanism, thereby unfavorably increasing the production cost.

SUMMARY OF THE INVENTION

Under such circumstances, it is a general object of the present invention to provide a first gasketed cover which is lightweight, excellent in sealing properties, and also efficiently producible at a low cost in high precision and accuracy even for intricate shapes without the need for a troublesome production step.

It is another object of the present invention to provide a second gasketed cover which is capable of preventing the generation of noises due to the vibration of a cover body, and excellent in sealing properties.

It is still another object of the present invention to provide an electronic equipment cover which is capable of preventing pressure difference from being caused between the inside and the outside of the main body of the above-mentioned electronic equipment with an inexpensive mechanism without placing a complicated breathing mechanism when pressure variation is caused inside or outside the main body thereof.

Other objects of the present invention will be obvious from the text of the specification hereinafter disclosed.

In view of the above, intensive extensive research and investigation were accumulated by the present inventors in order to achieve the above-mentioned objects. As a result, it has been found that the general object can been achieved by forming a cover body with a thermoplastic resin and at the same time, forming a gasket with a thermoplastic elastomer so as to prepare a gasketed cover in which the cover body is fitted with a gasket.

It has also been found that the object of preventing the generation of noises due to the vibration of the cover body can been achieved by integratedly installing at least one member composed of the elastomer same as that of the gasket on at least part of the plane portion of the cover body excluding the gasket portion so as to prepare a gasketed cover in which the cover body is fitted with a gasket.

It has further been found that the object of eliminating the pressure difference between the inside and the outside of the body of electronic equipment can been achieved by integratedly installing a membrane composed of an elastomer on the plane portion of the cover body so that pressure variation, when being caused inside or outside thereof, can be absorbed by the expansion of said membrane towards inside or outside.

It being so, the present invention has been accomplished by the above-mentioned findings and information.

Specifically, the present invention provides a first gasketed cover comprising a cover body which is composed of a thermoplastic resin and a gasket which is composed of a thermoplastic elastomer, said cover body being fitted with said gasket and integrated therewith.

Further, the present invention provides a second gasketed cover comprising a cover body; a gasket which is composed of an elastic body and integratedly attached to said cover body; and a member which is composed of the elastic body of a type same as or different from that of the gasket and integratedly installed on at least part of the plane portion of the cover body excluding the gasket portion. Further, the present invention provides an electronic equipment cover comprising a cover body and a membrane which is composed of an elastomer and is installed on a hole placed on the plane portion of the cover body, said cover body and said membrane being integrated with each other.

DESCRIPTION OF THE PREFERRED EMBODIMENTS

Figure 1:
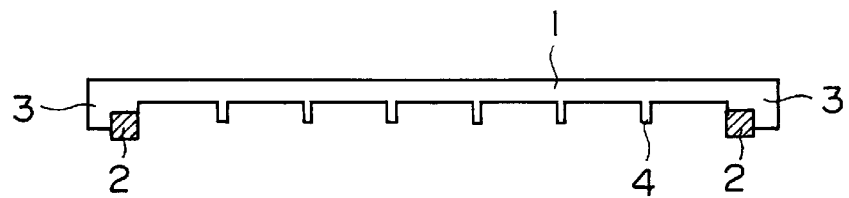
FIG. 1 is a cross sectional view showing a first gasketed cover according to the present invention.

The thermoplastic resin which constitutes the cover body in the first gasketed cover according to the present invention may be properly selected from among acrylonitrile styrene (AS) resin, acrylonitrile butadiene styrene (ABS) resin, styrenic resin such as polystyrene and syndiotactic polystyrene, olefinic resin such as polyethylene and polypropylene, polyamide resin such as nylon, polyester based resin such as polyethylene terephthalate and polybutylene terephthalate, modified polyphenylene ether, acrylic resin, polyacetal, polycarbonate, a liquid crystal polymer, polyphenylene sulfide (PPS) and the like. The liquid crystal polymer is preferably a thermotropic liquid crystal polymer, which is classified into those of polycarbonate base, polyurethane base, polyamide base, polyester base and the like, respectively. Of these, the polyester-base liquid crystal polymer is preferable in the present invention. Any one of the above-exemplified thermoplastic resins may be used alone or in combination with at least one other resin mentioned above.

In regard to the thermoplastic elastomer constituting the gasket according to the present invention, there are usable styrenic, olefinic, urethane based and ester based thermoplastic elastomers, of which is preferably usable in particular the copolymer comprising at least one polymer block composed principally of a vinylic aromatic compound and at least one polymer block composed principally of a conjugated diene compound.

More specific examples of said elastomers include:

① Block copolymer of crystalline polyethylene and ethylene/butylene styrene random copolymer, said block copolymer being obtained by hydrogenating block copolymer of polybutadiene and butadiene-styrene random copolymer; and ② Block copolymer of polybutadiene and polystyrene, block copolymer of polyisoprene and polystyrene, diblock copolymer of crystalline polyethylene and polystyrene, said diblock copolymer being obtained by hydrogenating block copolymer of polybutadiene or ethylene-butadiene random copolymer and polystyrene, triblock copolymer (SEBS) of styrene-ethylene/butylene-styrene, and triblock copolymer (SEPS) of styrene-ethylene/propylene-styrene, in particular, block copolymer of styrene-ethylene/butylene-styrene, and block copolymer of styrene-ethylene/propylene-styrene. Any one of the above-exemplified thermoplastic elastomers may be used alone or in combination with at least one other elastomer mentioned above.

No specific restriction is imposed upon the combination of the thermoplastic resin as a material of the cover body and the thermoplastic elastomer as a material of the gasket. There are exemplified the combination of olefinic resin and styrenic elastomer or olefinic elastomer, the combination of nylon or ABS resin and urethane based elastomer, and the like.

The thermoplastic resin or the thermoplastic elastomer can be imparted with an antistatic property by adding thereto, a filler capable of imparting electroconductivity thereto. By imparting an antistatic property, it is made possible to prevent dust or dirt from sticking to the gasket and cover body in the production step of the gasketed cover. Examples of fillers capable of imparting electroconductivity include powders and fibers of a metal such as iron, stainless steel and aluminum, electroconductive fillers such as carbon black and carbon fiber, polyalkylamine, polyalkylsulfonate, quaternary ammonium chloride and alkylbetaine.

The amount of the above-mentioned fillers to be added to the thermoplastic resins or thermoplastic elastomers is preferably such an amount that the resins or elastomers are made to have each a volume resistivity of at most $1 \times 10^8$ $\Omega$ cm. In the case that the cover body is required to have properties of shielding electromagnetic wave, said volume resistivity is preferably at most $1 \times 10^2$ $\Omega$ cm. In addition, the thermoplastic elastomers, when incorporated with any one of the fillers, have each JIS hardness A of preferably at most 80 degrees, particularly preferably in the range of 10 to 50 degrees.

It is possible in the present invention to add a reinforcing material to the foregoing thermoplastic resins or thermoplastic elastomers to the extent that the effects of the present invention are not impaired. Said reinforcing material is exemplified by inorganic fiber such as glass fiber and carbon fiber, inorganic filler such as mica and talc, and whiskers of potassium titanate and the like.

The integration of the cover body and the gasket is made, for instance, by the junction between the thermoplastic resin constituting the cover body and the thermoplastic elastomer constituting the gasket, specifically by means of two-color molding method, inserting molding method or the like.

By means of the two-color molding method, there is formed the composite gasketed cover in which the thermoplastic resin is integrated with the thermoplastic elastomer layer formed thereon through the steps of firstly subjecting the thermoplastic resin constituting the cover body to melt injection molding into a die with an injection molding machine for exclusive use, and after the thermoplastic resin molding thus formed is solidified, subjecting the thermoplastic elastomer which constitutes the gasket and is excellent in fusion adhesivity to melt injection molding with an injection molding machine for exclusive use so as to form the thermoplastic elastomer layer on part of the thermoplastic resin molding. The two-color molding method is capable of producing composite gasketed covers in high production efficiency at a low cost.

On the other hand, by means of the inserting molding method, there is obtained the composite gasketed cover in which the thermoplastic resin constituting the cover body is integrated with the thermoplastic elastomer layer formed on part of the resin through the steps of preparing in advance, the cover body having a prescribed shape by any of various well known molding methods, placing the resultant cover body in a die, and then forming the thermoplastic elastomer layer on part of the cover body.

It is made possible in the first gasketed cover according to the present invention to dispense with a rust preventive step and reduce the weight of the same owing to the nonuse of a metallic material; efficiently produce the same using a single mold in high accuracy and precision at a low cost owing to the use of a thermoplastic resin; recycle the material; produce highly vibration-proof product owing to the use of a resin material excellent in vibration-proofness; thereby prevent the generation of vibration and noises; produce a gasket by means of injection molding method owing to the use of the thermoplastic elastomer as the gasket material; thus dispense with such procedure as punching work of a material, adhesion work by using a double coated tape and the like.

In summary, the first gasketed cover according to the present invention can be efficiently produced in high accuracy and in high precision at a low cost into an intricate configuration with minimized waste material at the time of production without necessitating a troublesome step. Besides, said cover is excellent in lightweightness and sealing properties.

With regard to the second gasketed cover according to the present invention, the material which constitutes the cover body is not specifically limited, but can be properly selected for use according to the purpose of use thereof from cold rolled steel sheets, galvanized steel sheets, aluminum/zinc alloy plated steel sheets, stainless steel sheets, aluminum sheets, aluminum alloy sheets, magnesium sheets, magnesium alloy sheets, and the like. There are also usable injection molded magnesium sheets. From the viewpoint of corrosion resistance, there are preferably usable metallic sheets treated with non-electrolytic nickel plating, As the non-electrolytic nickel plating, there can be used a conventional method which has heretofore been applied to metallic raw material such as a method which comprises immersing a metallic sheet to be treated in a non-electrolytic nickel plating bath consisting of an aqueous solution at a pH of 4.0 to 5.0 approx. at a temperature of 85 to 95° C. approx. which contains, for instance, nickel sulfate, sodium hypochlolite, lactic acid, propionic acid and the like each at a proper proportion.

The thickness of the metallic sheet to be used in the second gasketed cover according to the present invention, is properly selected according to the purpose of use of the cover body, and is in the range of usually 0.3 to 1.0 mm, preferably 0.4 to 0.6 mm.

The thermoplastic resin, when used for forming the cover body in the second gasketed cover according to the present invention, is exemplified by those which have been enumerated in the description of the first gasketed cover.

The elastic body which constitutes the gasket and the member in the second gasketed cover according to the present invention may be selected for use from vulcanized rubber such as butyl rubber and EPDM, and thermoplastic elastomers. The thermoplastic elastomers, when used for forming the the gasket and the member in the second gasketed cover, is exemplified by those which have been enumerated in the description of the first gasketed cover.

The elastic body which constitutes the gasket and the member is preferably a thermoplastic elastomer from the aspect of dispensing with time for vulcanization or the like in production. In addition, the combination of the material constituting the cover body and the elastic body constituting the gasket and the member is preferably the combination of a thermoplastic resin as the material for the cover body and a thermoplastic elastomer as the material for the gasket and the member from the point of view that even an article having a complicated shape can be efficiently produced in high accuracy and precision at a low cost. The combination of thermoplastic resin as the material for the cover body and thermoplastic elastomer as the material for the gasket and the member is not specifically limited, but is exemplified by the combination of an olefinic resin and a styrenic or olefinic elastomer, the combination of nylon or ABS resin and urethane based elastomer and the like. The member constituted of the elastic body of a type same as or different from that for the gasket exhibits a marked effect on suppressing the generation of noises, when located in the vicinity of the middle of the cover body.

It is possible in the present invention to add a reinforcing material to the foregoing thermoplastic resins or thermoplastic elastomers to the extent that the effects of the present invention are not impaired thereby. Said reinforcing material is exemplified by inorganic fibers such as glass fiber and carbon fiber, inorganic fillers such as mica and talc, and whiskers of potassium titanate and the like.

The integration of the cover body, the gasket and the member constituted of the material same as that for the gasket is made by the following methods. In the case of the elastomer being a thermoplastic elastomer, the gasket and the member constituted of the elastic body of a type same as or different from that for the gasket are injection molded to shape onto the cover body. In the case where the cover body is made of the thermoplastic resin, and the elastic body constituting the gasket and the member is the thermoplastic elastomer, the integration is made by the junction between said thermoplastic resin and thermoplastic elastomer, specifically by two-color molding method, inserting molding method or the like.

By means of the two-color molding method, there is formed the composite gasketed cover in which the thermoplastic resin is integrated with the thermoplastic elastomer layer formed thereon through the steps of firstly subjecting the thermoplastic resin constituting the cover body to melt injection molding into a die with an injection molding machine for exclusive use, and after the thermoplastic resin molding thus formed is solidified, subjecting the thermoplastic elastomer which constitutes the gasket and is excellent in fusion adhesivity to melt injection molding with an injection molding machine for exclusive use so as to form thermoplastic elastomer layer on part of the thermoplastic resin molding.

On the other hand, by means of the inserting molding method, there is obtained the composite gasketed cover in which the thermoplastic resin constituting the cover body is integrated with the thermoplastic elastomer layer formed on part of the resin through the steps of preparing in advance, the cover body having a prescribed shape by any of various well known molding methods, placing the resultant cover body in a die, and then forming the thermoplastic elastomer layer on part of the cover body.

The second gasketed cover according to the present invention is capable of preventing the noises from being generated by the vibration of the cover body, and is excellent in sealing properties.

In regard to the electronic equipment cover according to the present invention, the material constituting the cover body is not specifically limited. There are usable a metallic sheet and a thermoplastic resin, which are exemplified by those which have been enumerated in the description of the second gasketed cover according to the present invention.

The thickness of the metallic sheet to be used in the electronic equipment cover according to the present invention, is properly selected according to the purpose of use of the cover body, and is in the range of usually 0.3 to 1.0 mm, preferably 0.4 to 0.6 mm.

The elastic body constituting the membrane has a JIS-hardness A of preferably at most 70 degrees, particularly preferably at most 50 degrees judging from the capability of promptly expanding to the inside and also the outside of electronic equipment in response to the pressure variation in the inside and outside thereof. There are usable as the elastic body, vulcanized rubber such as butyl rubber and EPDM, and thermoplastic elastomer. The thermoplastic elastomer is exemplified by those which have been enumerated in the description of the first gasketed cover.

The thickness of the membrane, which depends upon the elastic body constituting the same, ranges usually from 0.2 to 1.0 mm. Moreover, the electronic equipment cover according to the present invention may be equipped at need, with a gasket made of the elastic body of a type same as or different from that for the membrane.

The elastic body which constitutes the gasket and the membrane is preferably a thermoplastic elastomer from the aspect of dispensing with vulcanization time, etc. in production. Moreover, the combination of the material constituting the cover body and the material constituting the gasket and the membrane is preferably the combination of a thermoplastic resin as the material for the cover body and a thermoplastic elastomer as the material for the gasket and the membrane from the point of view that even an article having a complicated shape can be efficiently produced in high accuracy and precision at a low cost. The combination of thermoplastic resin as the material for the cover body and thermoplastic elastomer as the material for the gasket and membrane is not particularly limited, but is exemplified by the combination of an olefinic resin and a styrenic or olefinic elastomer, the combination of nylon or ABS resin and urethane based elastomer and the like.

The thermoplastic resin or the thermoplastic elastomer can be imparted with an antistatic property by adding thereto, a filler capable of imparting electroconductivity thereto. By imparting an antistatic property, it is made possible to prevent dust or dirt from sticking to the gasket and cover body in the production step of the gasketed cover. Examples of fillers capable of imparting electroconductivity include powders and fibers of a metal such as iron, stainless steel and aluminum, electroconductive fillers such as carbon black and carbon fiber, polyalkylamine, polyalkylsulfonate, quaternary ammonium chloride and alkylbetaine.

The amount of the fillers added to the thermoplastic resins or thermoplastic elastomers is preferably such an amount that the resins or elastomers have each a volume resistivity of at most $1 \times 10^8$ Ω cm. In the case of the cover body being required to have properties of shielding electromagnetic wave, said volume resistivity is preferably at most $1 \times 10^2$ Ω cm. In addition, the thermoplastic elastomers, when incorporated with any one of the fillers, have each a JIS hardness A of preferably at most 80 degrees, particularly preferably in the range of 10 to 50 degrees.

It is possible in the present invention to add a reinforcing material to the foregoing thermoplastic resins or thermoplastic elastomers to the extent that the effects of the present invention are not impaired thereby, said reinforcing material is exemplified by inorganic fibers such as glass fiber and carbon fiber, inorganic fillers such as mica and talc, and whiskers of potassium titanate and the like.

In an attempt to prepare the electronic equipment cover according to the present invention, at first a cover body having a through hole on a plane portion is prepared by means of injection molding method or the like. The integration of the cover body, the gasket which is provided at need and the membrane consisting of the elastic body of a type same as or different from that of the gasket, is made by any of the following methods. In the case where the elastic body which constitutes the membrane and the gasket is a thermoplastic elastomer, the integration is made by injection molding method so as to shape the gasket and the membrane onto the cover body. In this case, the membrane is integrated with the cover body by interposing the peripheral portion of the cover body hole with the elastic body at the outer periphery of membrane. In the case where the material for the cover body is a thermoplastic resin, and the materials for the gasket and membrane are each a thermoplastic elastomer, the integration is made by the junction between said thermoplastic resin and said thermoplastic elastomer, specifically by means of two-color molding method, inserting molding method or the like.

By means of the two-color molding method, there is formed the electronic equipment cover in which the thermoplastic resin is integrated with the thermoplastic elastomer layer formed thereon through the steps of firstly subjecting the thermoplastic resin constituting the cover body to melt injection molding into a die with an injection molding machine for exclusive use, and after the thermoplastic resin molding thus formed is solidified, subjecting the thermoplastic elastomer which constitutes the gasket and is excellent in fusion adhesivity to melt injection molding with an injection molding machine for exclusive use so that the thermoplastic elastomer layer is formed on part of the thermoplastic resin molding.

On the other hand, by means of the inserting molding method, there is formed the electronic equipment cover in which the thermoplastic resin constituting the cover body is integrated with the thermoplastic elastomer layer formed thereon through the steps of preparing in advance, the cover body having a prescribed shape by any of various well known molding methods, placing the resultant cover body in a die, and then forming the thermoplastic elastomer layer on part of the cover body.

The electronic equipment cover according to the present invention is capable of preventing a pressure difference from being generated between the inside and the outside of the main body of the electronic equipment.

In the following, the present invention will be described in further detail with reference to working examples, which however shall not limit the present invention thereto.

EXAMPLE 1

Figure 2:
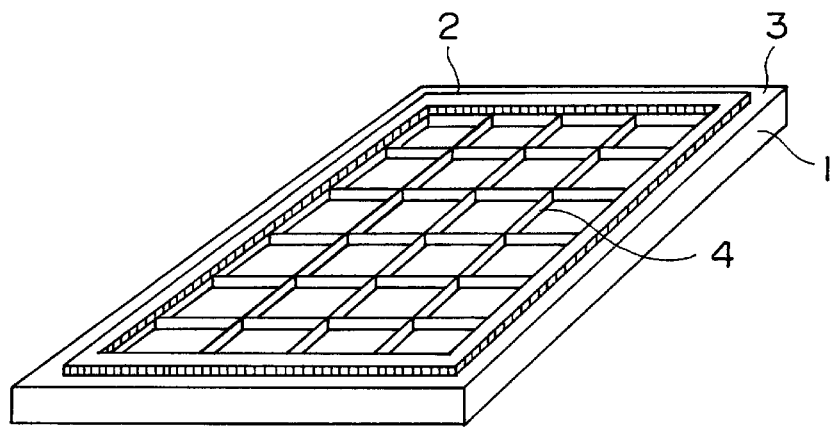
FIG. 2 is a perspective illustration which shows the gasketed cover as shown in FIG. 1, and which is viewed from the sealing surface side.

FIG. 1 is a cross sectional view showing the gasketed cover according to the present invention wherein the underside thereof indicates the sealing surface side. FIG. 2 is a perspective illustration viewed from the sealing surface side for the gasketed cover shown in FIG. 1. In both FIG. 1 and FIG. 2, the symbols mean the following: 1; cover body, 2; gasket, 3; flange, 4; rib, and the gasket 2 is fusedly bonded to the flange 3.

The gasketed cover was prepared by two-color molding method in accordance with the following procedures. Firstly, the thermoplastic resin constituting the cover body 1 was prepared by kneading 100 parts by weight of 33% short glass fiber-reinforced nylon (produced by Asahi Chemical Industry Co., Ltd. under the trade name "Reona 1300G") and 4 parts by weight of carbon black (produced by Mitsubishi Chemical Industry Co., Ltd. under the trade name "Ketchen Black EC"). The resultant thermoplastic resin for the cover body had a volume resistivity of $1 \times 10^5$ $\Omega$ cm. The thermoplastic elastomer constituting the gasket 2 was prepared by kneading 100 parts by weight of the urethane based elastomer (produced by Nippon Miractran Co., Ltd. under the trade name "Miractran E 660") and 4 parts by weight of carbon black (produced by Mitsubishi Chemical Industry Co., Ltd. under the trade name "Ketchen Black EC"). The resultant thermoplastic elastomer for the gasket had a volume resistivity of $1 \times 10^6$ $\Omega$ cm and a JIS hardness A of 70 degrees.

Thereafter, by the use of a molding machine (produced by Nissei Plastic Industrial Co., Ltd. under the trade name "DC40E 5ASE") the above-prepared thermoplastic resin for the cover body was subjected to melt injection molding into a die at a die temperature of 50° C. and a resin temperature of 280° C., and subsequently the above-prepared thermoplastic elastomer was subjected to melt injection molding onto the resultant molding in the die at a die temperature of 50° C. and resin temperature of 200° C. After all, there was prepared a gasketed cover in which the cover body and gasket were integratedly composited with each other. The gasketed cover thus prepared was used as the cover in a hard disc apparatus of a computer. As a result, sufficient sealing properties in the gasketed cover was maintained for a long period of time.

EXAMPLE 2

Figure 3:
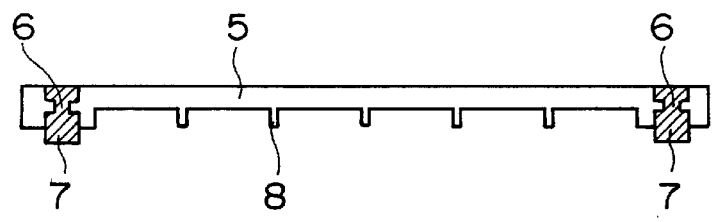
FIG. 3 is an another cross sectional view showing a first gasketed cover according to the present invention.

FIG. 3 is a cross sectional view showing the gasketed cover according to the present invention wherein the cover body and the gasket are non-fusedly bonded to each other. In FIG. 3, the symbols mean the following: 5; cover body, 6; anchor portion, 7; gasket, 8; rib.

The gasketed cover was prepared by injection molding method in accordance with the following procedures. Firstly, the thermoplastic resin constituting the cover body 5 was prepared by kneading 100 parts by weight of 30% glass fiber reinforced ABS resin (produced by Asahi Chemical Industry Co., Ltd. under the trade name "Styrack R 260A") and 4 parts by weight of carbon black (produced by Mitsubishi Chemical Industry Co., Ltd. under the trade name "Ketchen Black EC"). The resultant thermoplastic resin for the cover body had a volume resistivity of $1 \times 10^5$ $\Omega$ cm. The thermoplastic elastomer constituting the gasket 7 was prepared by kneading 100 parts by weight of the styrenic elastomer (produced by Mitsubishi Chemical Industry Co., Ltd. under the trade name "Rubberon MJ 4300B") and 4 parts by weight of carbon black (produced by Mitsubishi Chemical Industry Co., Ltd. under the trade name "Ketchen Black EC"). The resultant thermoplastic elastomer for the gasket had a volume resistivity of $1 \times 10^6$ $\Omega$ cm and a JIS hardness A of 45 degrees.

Thereafter, by the use of a molding machine (produced by Nissei Plastic Industrial Co., Ltd. under the trade name "FE120 S25 ASE") the above-prepared thermoplastic resin for the cover body was subjected to melt injection molding into a die at a die temperature of 50° C. and a resin temperature of 230° C., the resultant cover body was taken out from the die and was inserted in a die which had been fitted to an injection molding machine (produced by Nissei Plastic Industrial Co., Ltd. under the trade name "TH30 R5 VSE"), and subsequently the above-prepared thermoplastic elastomer for the gasket was subjected to injection molding onto the resultant molding at a die temperature of 50° C. and a resin temperature of 200° C. After all, there was prepared a gasketed cover in which the cover body and gasket were integratedly composited with each other. The gasketed cover thus prepared was used as the cover in a hard disc apparatus of a computer in the same manner as in Example 1. As a result, sufficient sealing properties in the gasketed cover was maintained for a long period of time.

EXAMPLE 3

The gasketed cover as illustrated in FIG. 3 was prepared by injection molding method in accordance with the following procedures. As the synthetic resin constituting the cover body 5, there was used 30% carbon fiber-reinforced polyphenylene sulfide (PPS) resin (produced by Tosoh Corporation under the trade name "SUSTEEL CH-30-12"). The resultant synthetic resin for the cover body had a volume resistivity of $6 \times 10^5$ Ω cm. The synthetic resin-based elastomer constituting the gasket 7 was prepared by kneading 100 parts by weight of the styrenic elastomer (produced by Mitsubishi Chemical Industry Co., Ltd. under the trade name "Rubberon MJ 4300B") and 4 parts by weight of carbon black (produced by Mitsubishi Chemical Industry Co., Ltd. under the trade name "Ketchen Black EC"). The resultant synthetic resin-based elastomer for the gasket had a volume resistivity of $1 \times 10^6$ Ω cm and a JIS hardness A of 45 degrees.

Thereafter, by the use of a molding machine (produced by Nissei Plastic Industrial Co., Ltd. under the trade name "FE120 S25 ASE") the above-prepared thermoplastic resin for the cover body was subjected to melt injection molding into a die at a die temperature of 140° C. and a resin temperature of 320° C., the resultant cover body was taken out from the die and was inserted in a die which had been fitted to an injection molding machine (produced by Nissei Plastic Industrial Co., Ltd. under the trade name "TH30 R5 VSE"), and subsequently the above-prepared thermoplastic elastomer for the gasket was subjected to injection molding onto the resultant molding at a die temperature of 50° C. and a resin temperature of 200° C. After all, there was prepared a gasketed cover in which the cover body and gasket were integratedly composited with each other. The gasketed cover thus prepared was used as the cover in a hard disc apparatus of a computer in the same manner as in Example 1. As a result, sufficient sealing properties in the gasketed cover was maintained for a long period of time.

EXAMPLE 4

Figure 4:
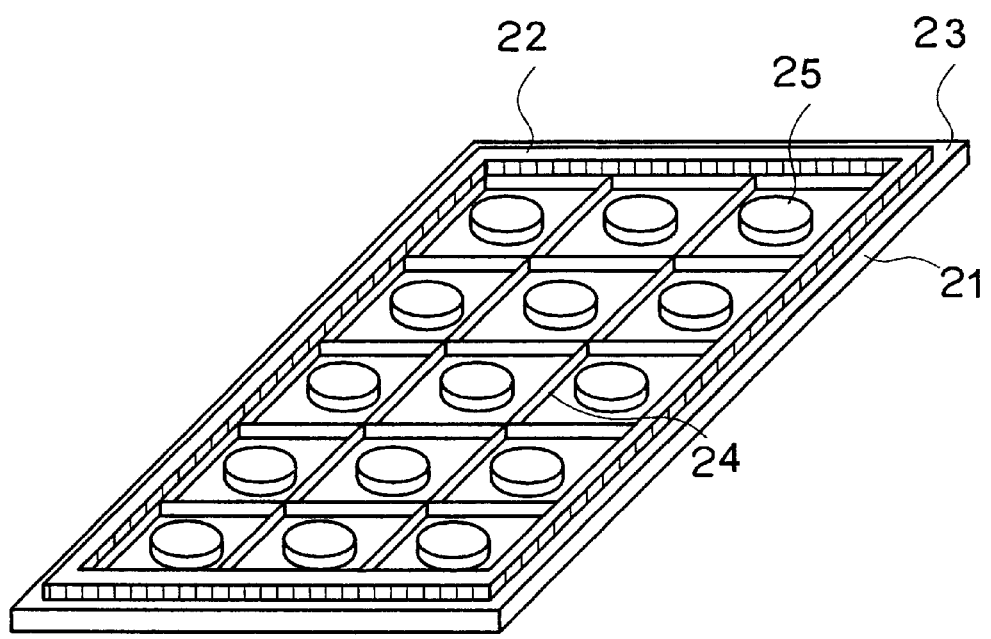
FIG. 4 is a perspective illustration which shows a second gasketed cover according to the present invention, and which is viewed from the sealing surface side.

FIG. 4 is a perspective illustration viewed from the sealing surface side for the gasketed cover according to the present invention. In FIG. 4, the symbols mean the following: 21; cover body, 22; gasket, 23; flange, 24; rib, 25; member consisting of the elastic body same as that for the gasket. The gasket 22 is fusedly bonded to the flange 23, and the member 25 is fusedly bonded to each of middle parts of the plane portion of the cover body 21 that is divided with ribs 24. The gasketed cover has a size of 100 mm×70 mm, and the member 25 has a diameter of 10 mm and a height of 1 mm.

The gasketed cover was prepared by two-color molding method in accordance with the following procedures. There were used 33% short glass fiber-reinforced nylon (produced by Asahi Chemical Industry Co., Ltd. under the trade name "Reona 1300G") as the thermoplastic resin constituting the cover body 21, and the urethane based elastomer (produced by Nippon Miractran Co., Ltd. under the trade name "Miractran E 660") as the thermoplastic elastomer constituting the gasket 22 and the member 25. The thermoplastic elastomer had a JIS hardness A of 70 degrees.

Thereafter, by the use of a molding machine (produced by Nissei Plastic Industrial Co., Ltd. under the trade name "DC 60E 5ASE") the above-prepared thermoplastic resin for the cover body was subjected to melt injection molding into a die at a die temperature of 50° C. and a resin temperature of 280° C., and subsequently the above-prepared thermoplastic elastomer was subjected to melt injection molding onto the resultant molding in the die at a die temperature of 50° C. and a resin temperature of 200° C. After all, there was prepared a gasketed cover in which the cover body and gasket were integratedly composited with each other. The gasketed cover thus prepared was used as the cover in a hard disc apparatus of a computer. As a result, it was recognized that noise generation was remarkably decreased as compared with the gasketed cover which was not equipped on the plane portion of the cover body 21 with the member consisting of the elastic body same as that of the gasket.

EXAMPLE 5

Figure 5:
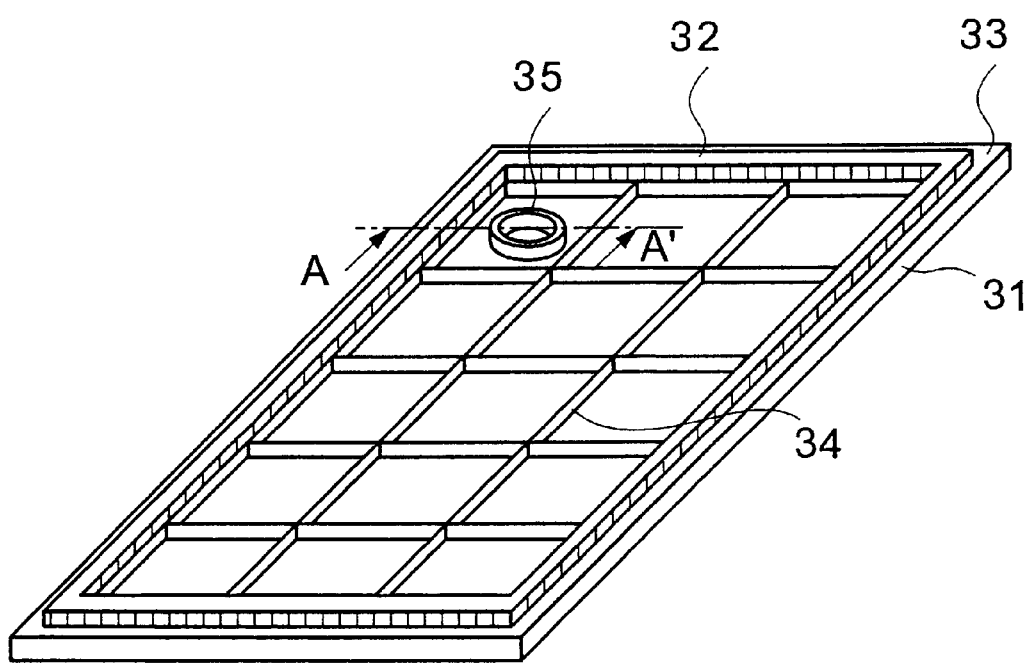
FIG. 5 is a perspective illustration which shows an electronic equipment cover according to the present invention, and which is viewed from the sealing surface side.
Figure 6:
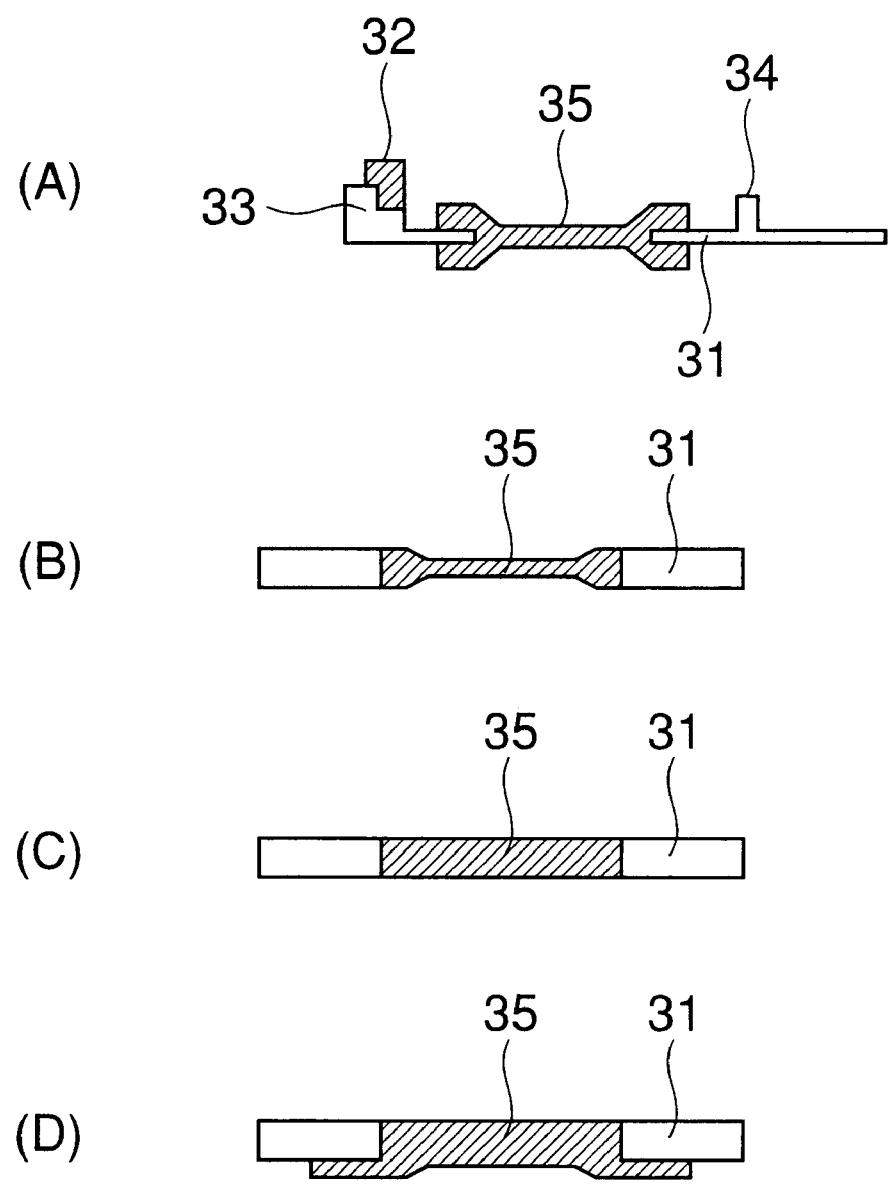
FIG. 6 is a cross sectional view which shows the electronic equipment cover as shown in FIG. 5 and which is taken on line A–A' of FIG. 5.

FIG. 5 is a perspective illustration viewed from the sealing surface side for the electronic equipment cover according to the present invention. In FIG. 5, the gasket and the membrane portion are fusedly bonded to the cover body. FIG. 6 is a cross sectional view taken on the line A–A' of FIG. 5. In FIG. 5 and FIG. 6 (A), the symbols mean the following: 31; cover body, 32; gasket, 33; flange, 34; rib, 35; membrane portion which consists of the elastic body same as that for the gasket and is located on the plane of the cover body 31. The gasketed cover has a size of 100 mm×70 mm, and the holes made in the cover body 31 has a diameter of 10 mm, and the membrane has a thickness of 0.4 mm.

The electronic equipment cover was prepared according to the following procedures. The thermoplastic resin constituting the cover body 1 was prepared by kneading 100 parts by weight of 33% short glass fiber-reinforced nylon (produced by Asahi Chemical Industry Co., Ltd. under the trade name "Reona 1300G") and 4 parts by weight of carbon black (produced by Mitsubishi Chemical Industry Co., Ltd. under the trade name "Ketchen Black EC"). The thermoplastic elastomer constituting the gasket 32 and the membrane 35 was prepared by kneading 100 parts by weight of SEPS having a number-average molecular weight of 100,000 and a styrene moiety of 30% by weight; 150 parts by weight of paraffin base oil having a kinematic viscosity at 40° C. of 380 cSt (produced by Idemitsu Kosan Co., Ltd. under the trade name "Diana Process Oil PW380"); and 12.5 parts by weight of polypropylene (produced by Mitsubishi Chemical Industry Co., Ltd. under the trade name "Mitsubishi polypropylene BC 05B"). The resultant thermoplastic elastomer for the gasket 32 and the membrane 35 had a JIS hardness A of 22 degrees.

Thereafter, by the use of a molding machine (produced by Nissei Plastic Industrial Co., Ltd. under the trade name "FE120 S25 ASE") the above-prepared thermoplastic resin for the cover body was subjected to melt injection molding into a die at a die temperature of 50° C. and a resin temperature of 230° C., the resultant cover body was taken out from the die and was inserted in a die which had been fitted to an injection molding machine (produced by Nissei Plastic Industrial Co., Ltd. under the trade name "TH30 R5 VSE"), and then the resultant thermoplastic elastomer was subjected to injection molding onto the resultant molding at a die temperature of 50° C. and a resin temperature of 200° C. After all, there was prepared a gasketed cover in which the cover body and gasket were integratedly composited with each other. The electronic equipment cover according to the present invention can take the configuration of any of FIG. 6 (B), FIG. 6(C) and FIG. 6 (D). The gasketed cover was used as the cover in a hard disc apparatus of a computer. As a result, over a long period of time the aforesaid gasketed cover was free from any malfunctioning considered to have arisen from the variation in the internal pressure of the main body of the hard disc apparatus.

What claimed is:

1. A gasketed cover comprising a cover body which is composed of a thermoplastic resin and a gasket which is composed of a thermoplastic elastomer, said cover body being fitted with said gasket and integrated therewith, wherein the thermoplastic resin is incorporated with a filler capable of imparting electroconductivity thereto, and said thermoplastic resin incorporated with a filler has a volume resistivity of at most $1 \times 10^8$ Ω cm.

2. The gasketed cover according to claim 1, wherein the thermoplastic resin which constitutes the cover body is integrated with the thermoplastic elastomer which constitutes the gasket by means of fused adhesion therebetween.

3. The gasketed cover according to claim 1, wherein said thermoplastic resin incorporated with a filler has a JIS hardness-A of at most 80 degrees.

4. The gasketed cover according to claim 1, wherein the thermoplastic resin which constitutes the cover body comprises a liquid crystal polymer or polyphenylene sulfide resin.

5. A gasketed cover comprising a cover body which is composed of a thermoplastic resin; a gasket which is composed of an elastic body integratedly attached to said cover body; and a member which is composed of the elastic body of a same type as that of the gasket and integratedly installed on at least part of the plane portion of the cover body excluding the gasket portion, wherein the thermoplastic resin is incorporated with a filler capable of imparting electroconductivity thereto, and said thermoplastic resin incorporated with a filler has a volume resistivity of at most $1 \times 10^8$ Ω cm.

6. The gasketed cover according to claim 5, wherein the elastic body which constitutes the gasket is composed of a thermoplastic elastomer.

7. The gasketed cover according to claim 5, wherein the thermoplastic resin which constitutes the cover body is integrated with the elastic body by means of fused adhesion therebetween, said elastic body constituting the gasket and the member which is composed of the elastic body of the same type as that of the gasket.

8. An electronic equipment cover comprising a cover body which is composed of a thermoplastic resin and a membrane which is composed of an elastic body and is installed on a hole placed on the plane portion of the cover body, said cover body and said membrane being integrated with each other, wherein the thermoplastic resin is incorporated with a filler capable of imparting electroconductivity thereto, and said thermoplastic resin incorporated with a filler has a volume resistivity of at most $1 \times 10^8$ Ω cm.

9. The electronic equipment cover according to claim 8, comprising a cover body and a membrane which is composed of an elastic body and is installed on a hole placed on the plane portion of the cover body, said cover body and said membrane being integrated by that the peripheral portion of said hole is interposed between the outer peripheral portion of said membrane.

10. The electronic equipment cover according to claim 8, which further comprises a gasket which is composed of the elastic body of a same type as that of the membrane on the plane portion of the cover body excluding the hole portion thereof, said cover body and said gasket being integrated to constitute a gasketed cover.

11. The electronic equipment cover according to claim 8, wherein the elastic body constituting the membrane is a thermoplastic elastomer.

12. The electronic equipment cover according to claim 8, wherein the elastic body constituting the gasket and the membrane is a thermoplastic elastomer.

13. The electronic equipment cover according to claim 12, wherein the thermoplastic resin which constitutes the cover body is integrated with the elastic body which constitutes the gasket and the member by means of fused adhesion therebetween, said member being composed of the elastic body same as that of the gasket.

* * * * *